United States Patent [19]

Gilson

[11] 4,096,443

[45] Jun. 20, 1978

[54] BALANCED SOURCE FOLLOWER AMPLIFIER

[76] Inventor: Warren E. Gilson, 4 Franklin Ave., Madison, Wis. 53705

[21] Appl. No.: 769,005

[22] Filed: Feb. 16, 1977

[51] Int. Cl.² .............................................. H03F 3/26
[52] U.S. Cl. .................................... 330/267; 330/264; 330/276
[58] Field of Search ......................... 330/264, 267, 276

[56] References Cited

U.S. PATENT DOCUMENTS

| | | | |
|---|---|---|---|
| 3,094,673 | 6/1963 | Maupin | 330/15 |
| 3,348,160 | 10/1967 | Lee et al. | 330/15 |

OTHER PUBLICATIONS

Crawford — "The Riddle of the Follower Family," Science and Electronics—pp. 33-35, Jun.-Jul. 1970.

*Primary Examiner*—Lawrence J. Dahl
*Attorney, Agent, or Firm*—Mason, Kolehmainen, Rathburn & Wyss

[57] ABSTRACT

A low distortion audio amplifier utilizes a pair of field effect transistors connected in a balanced source follower configuration. A tapped inductor connected between the sources of the field effect transistors provides inductive coupling between the sources and maintains the sources at the same direct current potential. This permits the voice coil of a loud speaker to be connected directly across the sources without causing excessive direct current to flow through the voice coil.

10 Claims, 1 Drawing Figure

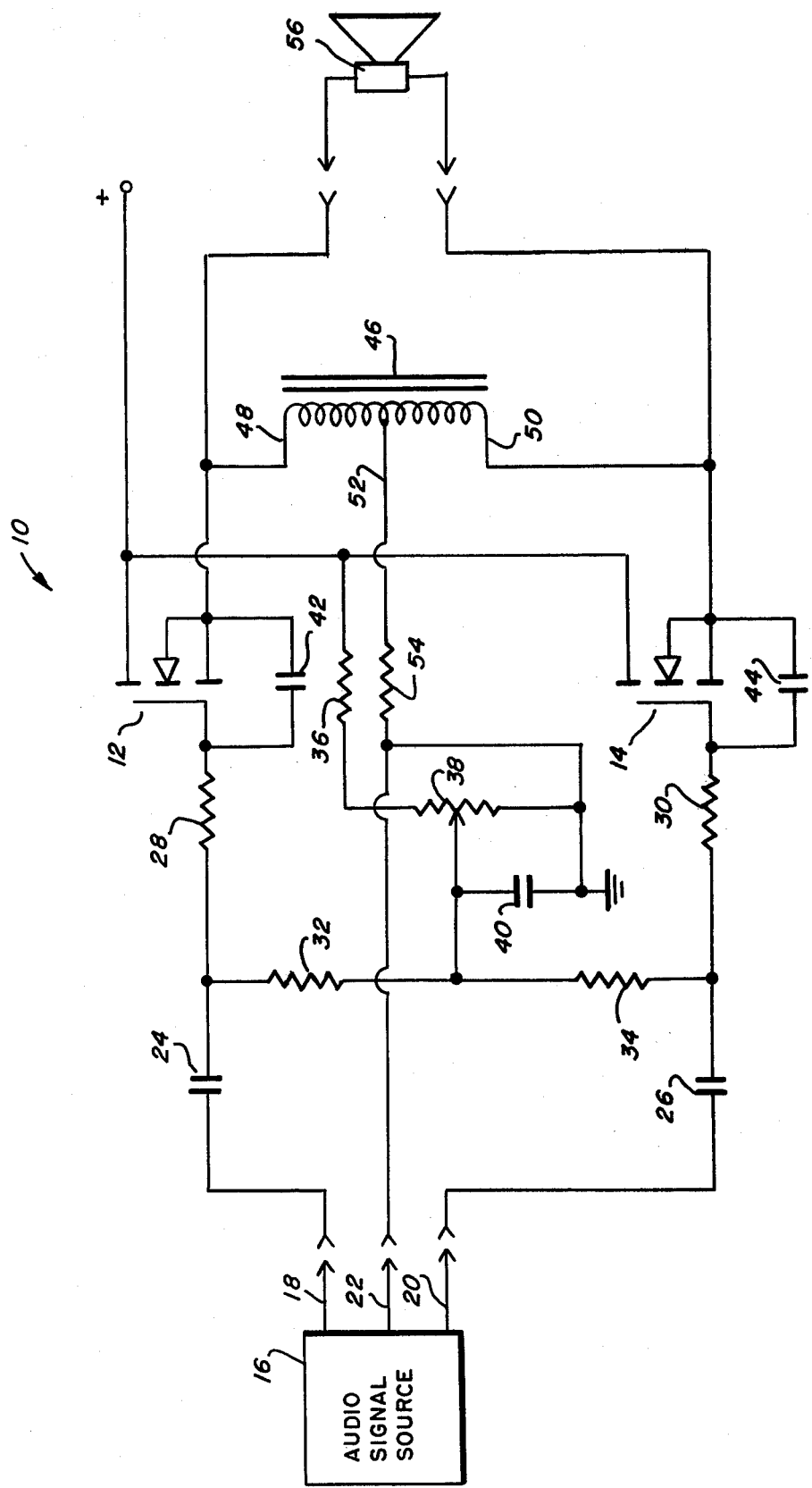

BALANCED SOURCE FOLLOWER AMPLIFIER

BACKGROUND OF THE INVENTION

A. Field of the Invention

This invention relates generally to amplifiers and, more particularly, to balanced direct coupled power amplifiers used for powering loud speaker systems.

B. Description of the Prior Art

Transistorized power amplifiers suitable for driving loud speakers are known. A variety of configurations may be used for such amplifiers, such as complementary symmetry transistors (one PNP and one NPN transistor or one P-channel and one N-channel FET) connected as push-pull emitter followers or push-pull common emitter stages; or like conductivity type transistors (both PNP or NPN transistors or both P-channel or N-channel FETS) may be used in a push-pull configuration, with one of the transistors being operated as an emitter follower and the other of the transistors being operated as a common emitter stage.

While these systems provide a way to power a loud speaker system, several problems are associated with each of the prior art systems. For example, when a common emitter stage is used in a push-pull configuration in conjunction with an emitter follower stage, the gain characteristics of the two stages forming the push-pull circuit are inherently unequal. Consequently, feedback circuitry must be employed to compensate for such differences, and to reduce the distortion caused by such differences. Such feedback circuitry usually takes the form of an external feedback loop, such as collector to base feedback. Similarly, feedback must be employed when two complementary symmetry stages are connected in a common emitter configuration to reduce distortion inherent in common emitter stages. Such feedback increases the complexity of the amplifier, and reduces its stability.

Another problem associated with the prior art transistor amplifiers arises in the coupling of the loud speaker system to the output of the amplifier. Direct coupling to the amplifier is advantageous from a simplicity and low-frequency response standpoint, but such direct coupling results in a direct current path through the loud speaker which can cause excessive direct current to flow through the voice coil of the loud speaker. Such direct current can adversely bias or saturate the voice coil of the loud speaker and result in distortion. Consequently, in order to avoid such a direct current flow, the prior art amplifiers utilize coupling capacitors in series with the loud speaker to block such direct current flow, or employ a split power supply that maintains the potential difference between the terminals of the amplifier to which the loud speaker is connected at substantially the same potential.

The use of capacitor coupling has the disadvantage that unless a very large capacitor is used, an attenuation of low frequencies results. Furthermore, the use of a capacitor in series with the loud speaker can produce a loud pop in the speaker during the time the capacitor is being charged after the unit is turned on. The use of a split power supply requires precise balancing of the amplifier, and usually requires a balance control to maintain the output terminals of the amplifier at the same potential. Furthermore, failure of a component in the output or balancing circuits of the amplifier can cause substantial direct current to flow through the speaker. In addition both solutions significantly increase the cost of the amplifier.

SUMMARY OF THE INVENTION

Accordingly, it is an object of the present invention to provide an improved amplifier that overcomes many of the disadvantages of the prior art amplifiers.

It is another object of the present invention to provide an improved audio amplifier that provides good frequency response and low distortion without the use of an external feedback loop.

It is another object of the present invention to provide an improved audio amplifier having output terminals that are maintained at the same direct current potential without the use of a split power supply.

It is another object of the present invention to provide an improved audio amplifier that is not subject to the instabilities generally associated with amplifiers employing external feedback loops.

In accordance with a preferred embodiment of the invention, a pair of field effect transistors are connected in a balanced source follower configuration with the drains of the field effect transistors each being connected to one terminal of a direct current power source. The sources of the field effect transistors are connected to opposite ends of a center tapped inductor. The center tap of the inductor is connected to the other terminal of the power source, preferably through a low value resistor, and provides a D.C. return for the sources. The gates of the field effect transistors are driven by out of phase signals from an appropriate signal source, such as a suitable preamplifier. The loud speaker can be connected directly across the tapped inductor, and because of the low direct current resistance of the tapped inductor, only minimal current flows through the voice coil of the speaker. The inductive reactance of the inductor provides a relatively high impedance to alternating current, and causes most of the alternating current output signal from the amplifier to be applied to the loudspeaker.

These and other objects and advantages of the present invention will be readily apparent from the following specification and attached drawing wherein:

The single FIGURE is a schematic diagram of one embodiment of the amplifier according to the invention.

DETAILED DESCRIPTION OF THE PREFERRED EMBODIMENT

Referring now to the drawing, there is illustrated an amplifier according to the invention generally designated by the reference numeral 10. The amplifier 10 utilizes, as amplifying elements, a pair of insulated gate metal oxide silicon field effect transistors or MOSFETS 12 and 14 connected in a push-pull source follower configuration. In the present embodiment, type VMP 12 N-channel vertical metal oxide silicon field effect transistors, manufactured by Siliconix Incorporated of Santa Clara, California are utilized; however, other insulated gate field effect transistors, junction field effect transistors or bipolar transistors may be used. Since the preferred embodiment utilizes field effect transistors, field effect transistor terminology will be used, with the three electrodes of the MOSFETS 12 and 14 being designated in field effect transistor terminology as the source, gate and drain electrodes; however, it should be understood that these terms are intended to encompass the analogous emitter, base and collector electrodes, respectively, of bipolar transistors if such bipolar transistors are used.

The drains of the MOSFETS 12 and 14 are connected together and to a source of positive potential, either directly as shown in the FIGURE, or if necessary, by means of low value current limiting or voltage dropping resistors. The gates of the MOSFETS 12 and 14 are connected to a source of audio signals 16, which, in this embodiment, is a balanced source having a pair of out-of-phase outputs 18 and 20 and a neutral or common output 22. In a practical embodiment, such a source 16 would be a conventional preamplifier stage having out-of-phase outputs. The out-of-phase outputs 18 and 20 are connected to the respective gates of the MOSFETS 12 and 14 through a pair of respective coupling networks utilizing a pair of coupling capacitors 24 and 26 and a pair of resistors 28 and 30, and the signals from the source 16 are current amplified by the MOSFETS 12 and 14. Bias for the MOSFETS 12 and 14 is supplied by a biasing network including a pair of resistors 32 and 34 coupling the gates of the MOSFETS 12 and 14 to the positive source of potential via a resistor 36 and a bias adjusting potentiometer 38. A capacitor 40 is used to bypass audio frequency signals appearing at the junction of the resistors 32 and 34 to ground. A pair of radio frequency bypass capacitors 42 and 44 bypass signals in the radio frequency range around the gate and source electrodes of the MOSFETS 12 and 14. The capacitors 42 and 44 may be eliminated in many instances.

In accordance with an important aspect of the invention, a center tapped inductor 46 having a pair of end taps 48 and 50 and a center tap 52 is utilized to couple the source electrodes of the MOSFETS 12 and 14 together and to provide a direct current return between the sources of the MOSFETS 12 and 14 and ground potential through the two halves of the inductor 46 and a current limiting resistor 54. Any inductor capable of operating at audio frequencies and having a sufficient current carrying capacity to carry the source current of the MOSFETS 12 and 14 may be used, and in the present embodiment, an autotransformer designed to step up 115 volts to 230 volts at 60 cycles is used as the inductor 46. Such an autotransformer utilizes relatively low grade core material, and the use of such an autotransformer indicates that high grade core material is not necessary for the inductor 46, and that a relatively inexpensive inductor may be used.

The use of a center tapped inductor in the source circuit of the MOSFETS 12 and 14 has several advantages. Firstly, the low resistance between end taps 48 and 50 maintains the sources of the MOSFETS 12 and 14 at substantially the same direct current potential, and permits a load such as a loud speaker 56 to be directly connected across the inductor 46 without causing substantial direct current to flow through the voice coil of the loud speaker 56. The inductive reactance of the inductor 46 presents a relatively high impedance to audio frequencies, and causes the major portion of the audio frequency current flowing through the MOSFETS 12 and 14 to flow through the loud speaker 56. Consequently, very little audio frequency power is dissipated in the inductor 46, thus providing very efficient operation of the amplifier 10.

Obviously, many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. An amplifier usable for powering a load and operable in conjunction with an alternating current signal source and a direct current source having first and second terminals having a potential difference therebetween, comprising:

first and second transistors each having a source electrode, a gate electrode and a drain electrode;

means for establishing a direct current connection between each of said drain electrodes and the first terminal of said direct current source;

means for electrically coupling said first gate electrode to said first source electrode and for electrically coupling said second gate electrode to said second source electrode, said electrical coupling means including means for coupling at least one of said gate electrodes to said alternating current signal source;

a center tapped autotransformer having two end taps and a center tap;

means for providing a direct current connection between the source of said first transistor and one of said end taps and between the source of said second transistor and the other one of said end taps;

means for providing a direct current connection between said center tap and the second terminal of said direct current source; and means for connecting the load between said end taps.

2. An amplifier as recited in claim 1 wherein said means for establishing a direct current connection between said drain electrodes and said first terminal of said direct current source include means for directly connecting said drain electrodes to said first terminal.

3. An amplifier as recited in claim 1 wherein said means for coupling at least one of said gate electrodes to said alternating current signal source includes means for coupling both of said gate electrodes to said alternating current source.

4. An amplifier as recited in claim 1 wherein said means for providing a direct current connection between the source of said first transistor and one of said end taps and between the source of said second transistor and the other one of said end taps includes means for directly connecting the source of said first transistor to said one of said end taps and for directly connecting the source of said second transistor to the other one of said end taps.

5. An amplifier as recited in claim 1 wherein said means for providing a direct current connection between said center tap and said second terminal of said power supply includes a resistor connected between said center tap and said second terminal.

6. An amplifier as recited in claim 1 wherein said load is a loud speaker and said means for connecting said load between said end taps includes means for directly connecting said loud speaker between said end taps.

7. An amplifier as recited in claim 1 wherein said transistors are field effect transistors.

8. An amplifier as recited in claim 7 wherein said field effect transistors are insulated gate field effect transistors.

9. An amplifier as recited in claim 1 wherein said transistors are of a like conductivity type.

10. An amplifier as recited in claim 1 wherein said autotransformer is a power line frequency voltage conversion autotransformer.

* * * * *